(12) United States Patent
Seo

(10) Patent No.: US 10,847,735 B2
(45) Date of Patent: Nov. 24, 2020

(54) FOLDABLE DISPLAY DEVICE HAVING A SUPPORTER

(71) Applicant: SAMSUNG DISPLAY CO., LTD., Yongin-si (KR)

(72) Inventor: Tae An Seo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/676,947

(22) Filed: Nov. 7, 2019

(65) Prior Publication Data

US 2020/0212325 A1    Jul. 2, 2020

(30) Foreign Application Priority Data

Dec. 31, 2018  (KR) .......................... 10-2018-0174117

(51) Int. Cl.
| | | |
|---|---|---|
| *H01L 51/00* | (2006.01) | |
| *B32B 27/08* | (2006.01) | |
| *G06F 1/16* | (2006.01) | |
| *H01L 27/32* | (2006.01) | |
| *H05K 5/02* | (2006.01) | |

(52) U.S. Cl.
CPC .......... *H01L 51/0097* (2013.01); *B32B 27/08* (2013.01); *G06F 1/1616* (2013.01); *H01L 27/323* (2013.01); *H01L 27/3244* (2013.01); *H05K 5/0226* (2013.01); *B32B 2255/10* (2013.01); *B32B 2457/206* (2013.01); *H01L 2251/5338* (2013.01)

(58) Field of Classification Search
CPC ......... H01L 51/0097; H01L 2251/5338; B32B 27/08
See application file for complete search history.

(56) References Cited

U.S. PATENT DOCUMENTS

| | | | |
|---|---|---|---|
| 2017/0208157 A1 | 7/2017 | Kim et al. | |
| 2018/0242466 A1 | 8/2018 | Lee et al. | |
| 2018/0324964 A1* | 11/2018 | Yoo .................. | G06F 1/1652 |
| 2018/0341293 A1 | 11/2018 | Kim | |
| 2019/0073002 A1 | 3/2019 | Wu et al. | |
| 2020/0042042 A1* | 2/2020 | Park ................... | G06F 1/1641 |

FOREIGN PATENT DOCUMENTS

| | | |
|---|---|---|
| KR | 10-2016-0049235 | 5/2016 |
| KR | 10-2017-0001819 | 1/2017 |
| KR | 10-2017-0026023 | 3/2017 |
| KR | 10-2016-0049857 | 5/2018 |
| KR | 10-2018-0049856 | 5/2018 |
| WO | WO 2018-196290 | 11/2018 |

OTHER PUBLICATIONS

Extended European Search Report dated Mar. 31, 2020 for Application Serial No. 19218484.1.

\* cited by examiner

*Primary Examiner* — Selim U Ahmed
*Assistant Examiner* — Evan G Clinton
(74) *Attorney, Agent, or Firm* — F. Chau & Associates, LLC

(57) ABSTRACT

A foldable display device includes a display panel. The display panel includes a bending portion. A support structure supports the bending portion. The support structure includes a tube.

21 Claims, 14 Drawing Sheets

FOLDABLE DISPLAY DEVICE HAVING A SUPPORTER

CROSS-REFERENCE TO RELATED APPLICATION

This application claims priority to and the benefit of Korean Patent Application No. 10-2018-0174117 filed in the Korean Intellectual Property Office on Dec. 31, 2018, the entire contents of which are herein incorporated by reference.

TECHNICAL FIELD

The present disclosure relates to a display device, and more particularly, to a foldable display device having a supporter.

DISCUSSION OF THE RELATED ART

Display devices such as organic light emitting diode (OLED) display devices, liquid crystal displays, and the like are manufactured by forming various layers and elements on a substrate. Glass is often used as the display device substrate. However, glass substrates may be heavy and fragile. Also, since glass substrates tend to be rigid, glass substrates might not be well suited for use in a flexible display device. In recent years, flexible display devices have been developed using a flexible substrate that is lightweight, strong against impact, and easy to deform.

The flexible display devices may be categorized as foldable display devices, rollable display devices, and/or stretchable display devices, depending on their usage and type. Among them, the foldable display device may be folded flat against itself and unfolded as if it were a book.

The foldable display device may be folded to be compact and portable and may be unfolded to obtain a wide screen when being used. As the foldable display device is repeatedly folded and unfolded, the bending portion of the display device may develop a deformation and ultimately may be damaged.

SUMMARY

Exemplary embodiments of the present inventive concept provide a foldable display device capable of preventing deformation and damage to the display panel that would result from repeated folding and unfolding along a folding axis thereof.

A foldable display device according to an exemplary embodiment of the present inventive concept includes a display panel including a bending portion. A supporter supports the bending portion. The supporter includes a tubular supporter.

The supporter may include a plurality of supporting strips, and the tubular supporter may be disposed between the supporting strips and the display panel.

The tubular supporter may be in contact with the bending portion of the display device.

The tubular supporter may be fluid-filled.

The tubular supporter may be configured to expand or contract during the folding of the foldable display device.

The tubular supporter may be configured to expand or contract during bending.

The foldable display device may include a screen displaying an image. The screen may be folded outwardly so that the screen is exposed to the outside while in the folded state. The tubular supporter may expand at the time of folding the foldable display device.

The foldable display device may be folded inwardly so that the screen folds into itself and faces itself, and the tubular supporter may contract at the time of folding.

The foldable display device may further include a pressure controller controlling a pressure of the tubular supporter.

The pressure controller may include a cylinder and a piston, and the tubular supporter may be connected to the cylinder in fluid communication with the cylinder.

The display panel may further include a flat portion. The foldable display device may further include a supporting plate supporting the flat portion. The piston may be connected to the supporting plate.

At the time of folding the foldable display device, the supporting plate may move in one direction, and the piston may move in a movement direction of the supporting plate.

The flat portion may be attached to the supporting plate, and the bending portion might not be attached to the supporter.

The supporting strips may have cross-sectional shapes of a hexagon or inverted trapezoid.

Adjacent edges of the adjacent supporting strips among the supporting strips may be in contact with each other.

A foldable display device, according to an exemplary embodiment of the present inventive concept, includes a display panel including a first flat portion, a second flat portion, and a bending portion disposed between the first flat portion and the second flat portion. A first supporting plate supports the first flat portion. A second supporting plate supports the second flat portion. A supporter supports the bending portion. A hinge unit is disposed along at least one side of the bending portion. The supporter includes a plurality of supporting strips and a tubular supporter is disposed between the supporting strips and the bending portion.

An upper surface of the tubular supporter may be in contact with the bending portion, and a lower surface of the tubular supporter may be in contact with the supporting strips.

The foldable display device may further include a pressure controller supplying a fluid to or withdrawing a fluid from the tubular supporter. The pressure controller may be connected to the tubular supporter through a connection pipe.

The pressure controller may be connected to the first supporting plate or the second supporting plate by a connector.

The tubular supporter may include an elastomer.

Each of the supporting strips may have an inverted trapezoid cross-sectional shape, and upper surfaces of the supporting strips may coincide with a center of a hinge axis of the hinge unit.

The hinge unit may include a first hinge unit and a second hinge unit disposed on respective sides of the bending portion, and a third hinge unit disposed between the first hinge unit and the second hinge unit. Each of the supporting strip may include a first portion connected between the first hinge unit and the third hinge unit, and a second portion connected between the second hinge unit and the third hinge unit.

According to exemplary embodiments of the present inventive concept, at the time of folding the foldable display device, the deformation of and damage to the display panel, particularly the bending portion of the display panel, may be prevented or reduced.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
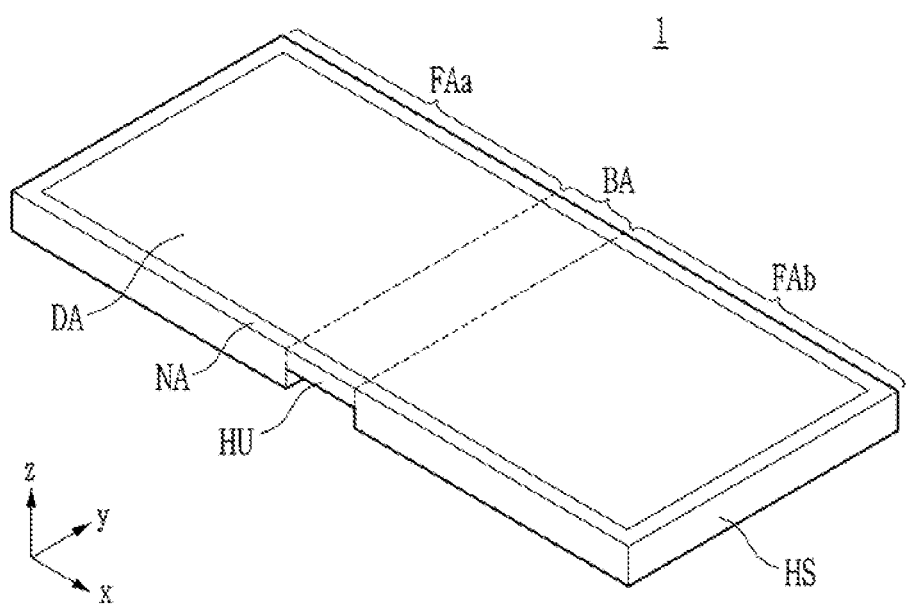
FIG. 1 is a perspective view schematically illustrating an unfolded state of a foldable display device according to an exemplary embodiment of the present inventive concept.

Exemplary embodiments of the present inventive concept will be described more fully hereinafter with reference to the accompanying drawings. As those skilled in the art would realize, the described embodiments may be modified in various different ways, all without departing from the spirit or scope of the present disclosure.

Some elements of the various devices and structures may be omitted in order to clearly describe the inventive concept. To the extent that a detailed description of elements has been omitted, it may be assumed that the omitted description is at least similar to that of corresponding elements that have already been described. In the specification and figures, like reference numerals may designate like elements.

In addition, the size and thickness of the various structures including layers, films, panels, areas, etc. in each configuration shown in the drawings may be exaggerated for clarity and ease of description. However, it is to be understood that the angles and relative sizes of the various elements shown in the figures is intended to show at least one exemplary embodiment of the present invention, and that while the present invention is not limited to the angles and relative sizes shown in the figures, it is contemplated that at least one exemplary embodiment may be so-arranged.

It will be understood that when an element such as a layer, film, area, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. However, the phrase "consisting of" will be understood to imply the exclusion of other elements.

In the drawing, an "x" may be used to indicate a first direction, a "y" may be used to indicate a second direction that is perpendicular to the first direction, and a "z" may be used to indicate a third direction that is perpendicular to the first direction and the second direction. The first direction x, the second direction y, and the third direction z may respectively correspond to a horizontal direction, a vertical direction, and a thickness direction of a foldable display device.

Hereinafter, the foldable display device, according to exemplary embodiments of the present disclosure, will be described in detail with reference to the drawings. First, the foldable display device is described in overview with reference to FIG. 1 to FIG. 3, and is then described in greater detail with reference to FIG. 4 to FIG. 11.

Figure 2:
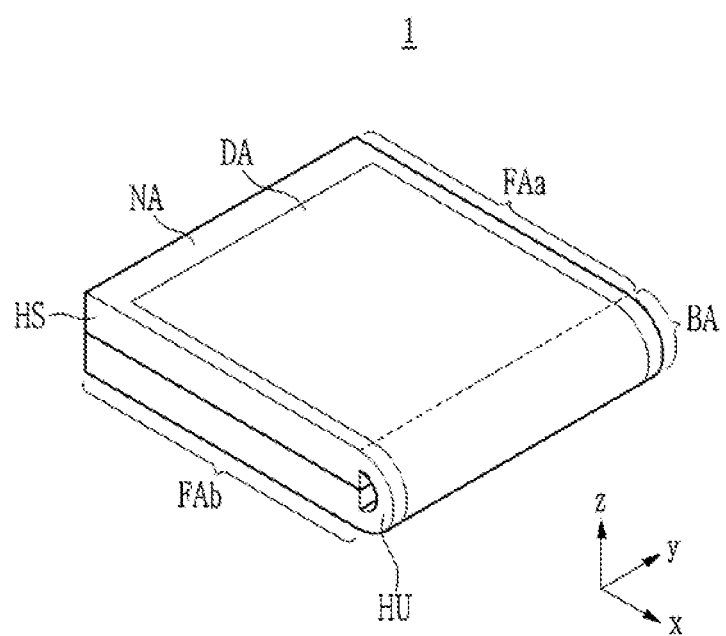
FIG. 2 is a perspective view schematically illustrating a first folding state of a foldable display device shown in FIG. 1.
Figure 3:
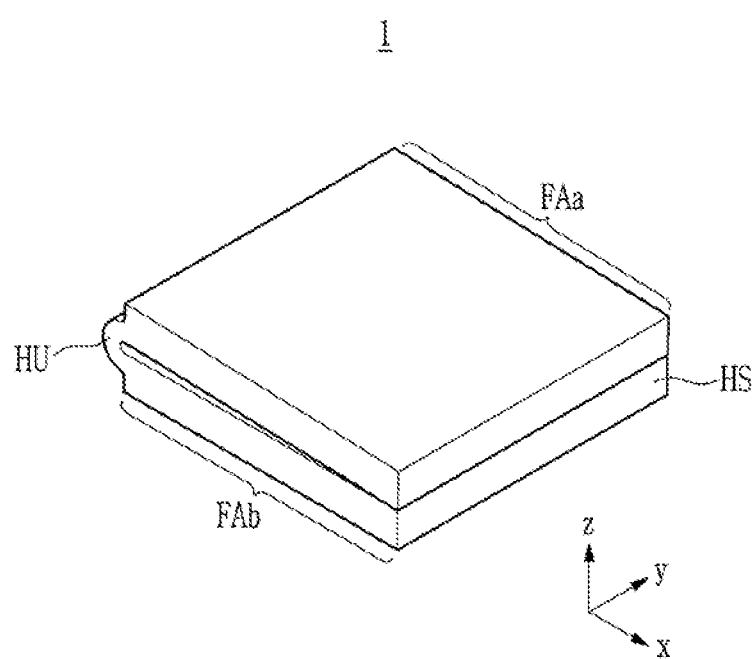
FIG. 3 is a perspective view schematically illustrating a second folding state of a foldable display device shown in FIG. 1.

FIG. 1 is a perspective view schematically illustrating an unfolded state of a foldable display device according to an exemplary embodiment of the present inventive concept. FIG. 2 is a perspective view schematically illustrating a first folding state of a foldable display device shown in FIG. 1. FIG. 3 is a perspective view schematically illustrating a second folding state of a foldable display device shown in FIG. 1.

The foldable display device 1 (hereinafter simply referred to as a display device), as shown in FIG. 1, may be unfolded to be entirely flat (e.g. planar), and may be folded as shown in FIG. 2 and FIG. 3. The display device 1 may include a bending area BA, and a first flat area FAa and a second flat area which are disposed on opposite sides of the bending area BA. The bending area BA is an area that is configured to be bent, and the first flat area FAa and the second flat area Fab are areas that remain substantially flat and planar.

While only one bending area BA is shown, the display device 1 may include a plurality of bending areas BA spaced from each other or bent to different curvature radiuses. For example, the display device 1 may include two or more bending areas and three or more flat areas.

The display device 1 may include a housing HS for receiving a display panel and protecting a non-display surface of the display panel. The housing HS may also contain and protect various other components such as a driving device (e.g. a driver circuit), a processor, a memory, a printed circuit board (PCB), a battery, a communication module, a speaker, various sensors, etc. The housing HS may include a frame, a cover, and the like.

The display device 1 includes a hinge unit HU. As the housing HS may be substantially rigid, the hinge unit HU is connected to the housing HS so that the display device 1 may be folded and unfolded. For example, the hinge unit HU serves as a rotation axis of the bending area BA and allows the bending area BA to be bent therealong during folding and unfolding.

The display device 1 includes a display area DA displaying an image and a non-display area NA at least partially surrounding the display area DA. The display area DA may correspond to a screen, and the non-display area NA may correspond to a bezel.

The display device 1, as shown in FIG. 2, may be folded out (hereinafter referred to as out-folding or first folding) so that the screen may be exposed to the outside while folded. Alternatively, the display device 1, as shown in FIG. 3, may be folded in (hereinafter referred to as in-folding or second folding) so that the screen faces itself, that is, the screen of the first flat area FAa and the screen of the second flat area FAb are folded into each other. In the out-folding state, the screen of the bending area BA may still be viewed by the user, and in the in-folding state, the screen of the bending area BA may be covered. The display device 1 may be formed, as shown in FIG. 2, so that only one of the out-folding and the in-folding is possible. Thus, some exemplary embodiments of the present disclosure may be transitioned between a flat state and a folded-in state, without being able to be folded-out while other exemplary embodiments of the present disclosure may be transitioned between a flat state and a folded-out state, without being able to be folded in. However, by the use of multiple bending areas, a single display device may be folded both in and out. For example, when the display device 1 includes a plurality of bending areas BA, one of the plurality of bending areas may be configured to fold the display out while another of the bending areas may be configured to fold the display in.

Now, the foldable display device according to an exemplary embodiment of the present disclosure will be described in detail with reference to FIG. 4 to FIG. 11.

Figure 4:
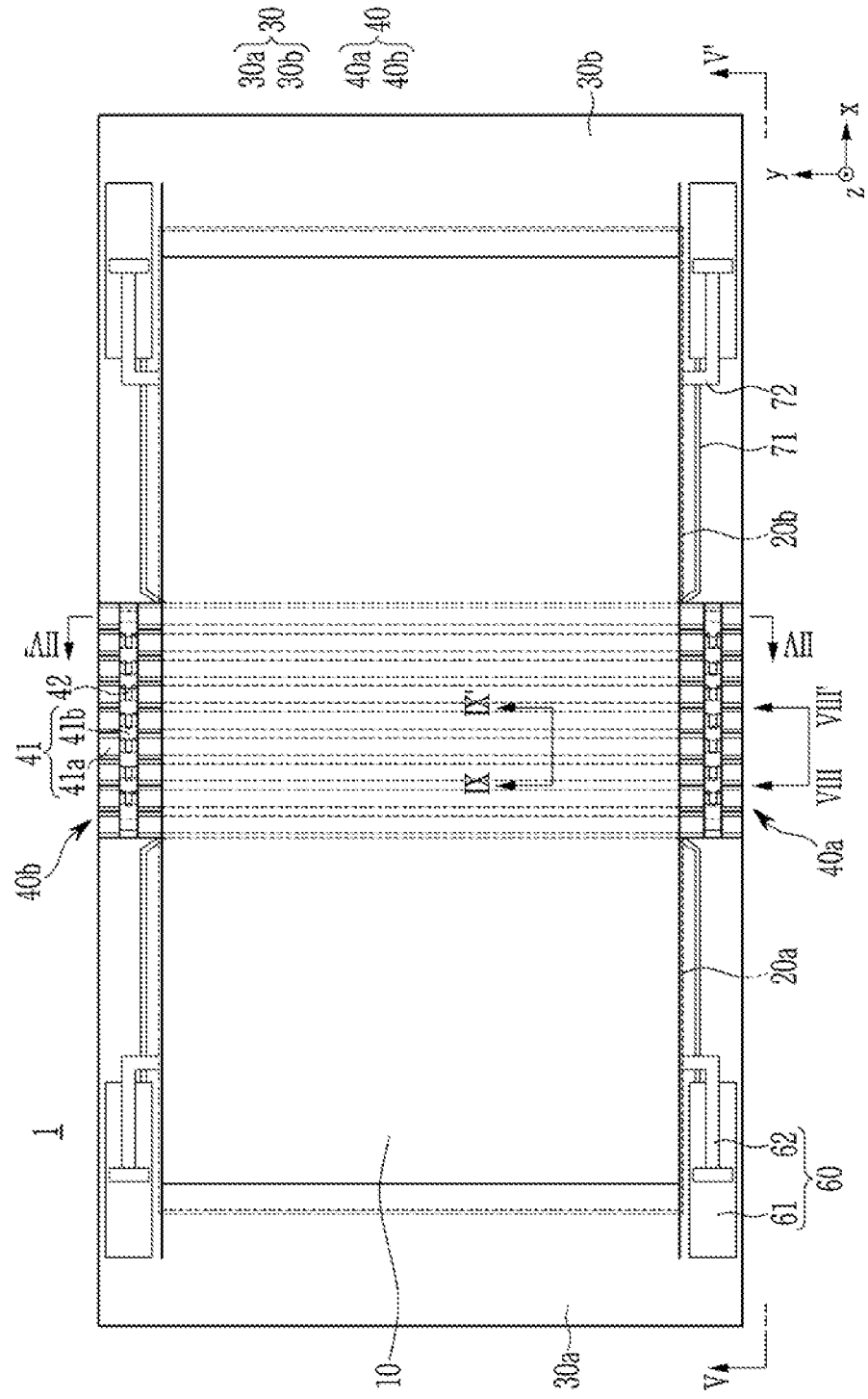
FIG. 4 is a top plan view of a foldable display device according to an exemplary embodiment of the present inventive concept.
Figure 5:
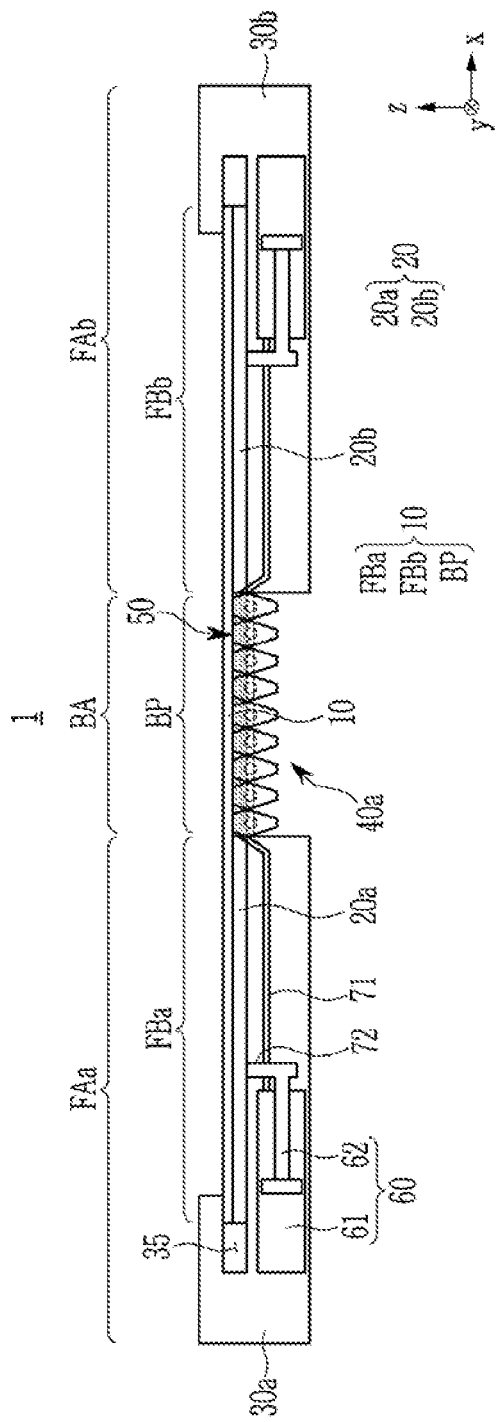
FIG. 5 is a lateral view taken along a line V-V' in FIG. 4.
Figure 6:
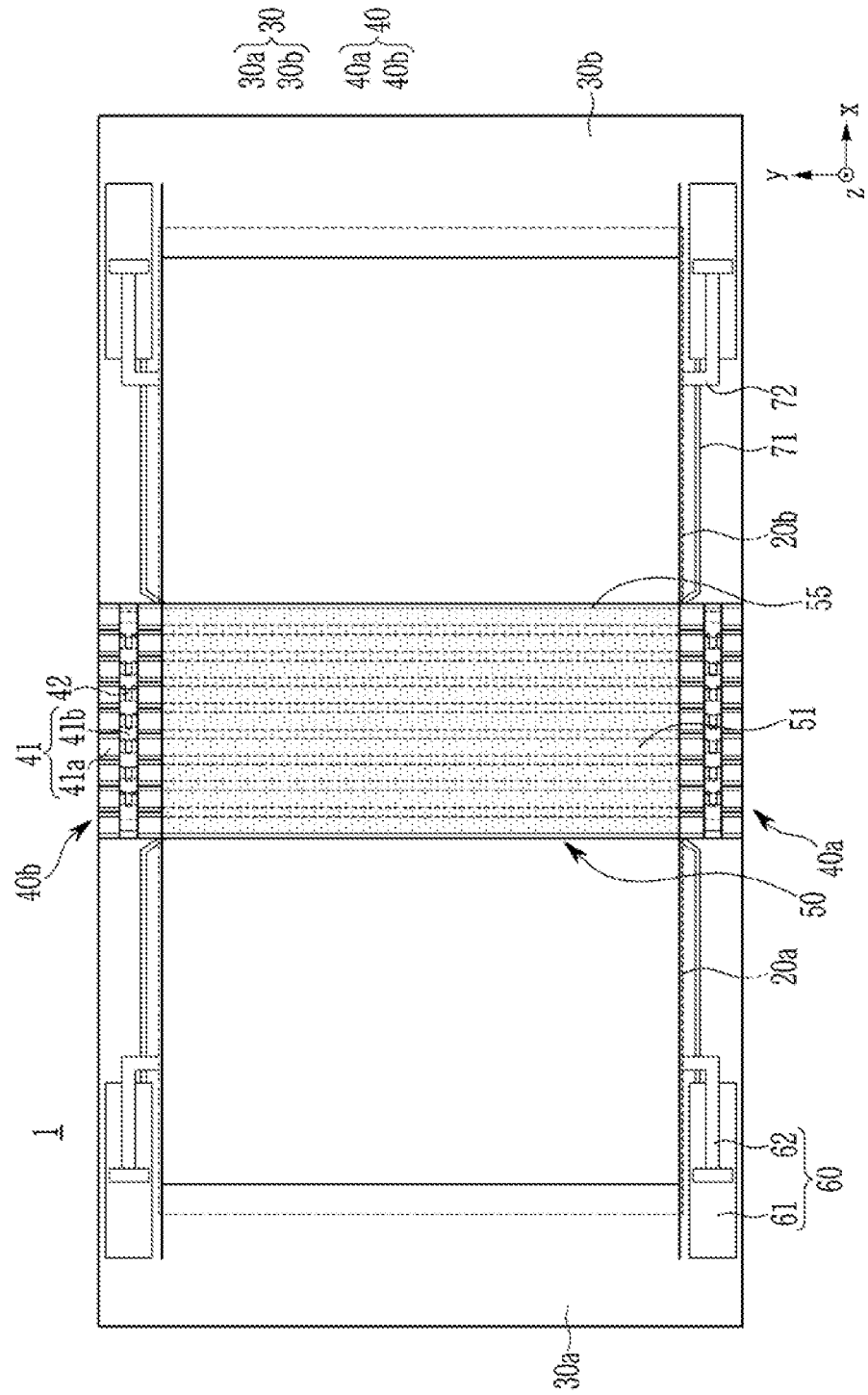
FIG. 6 is a top plan view of a foldable display device shown in FIG. 4 illustrated in a state without a display panel.
Figure 7:
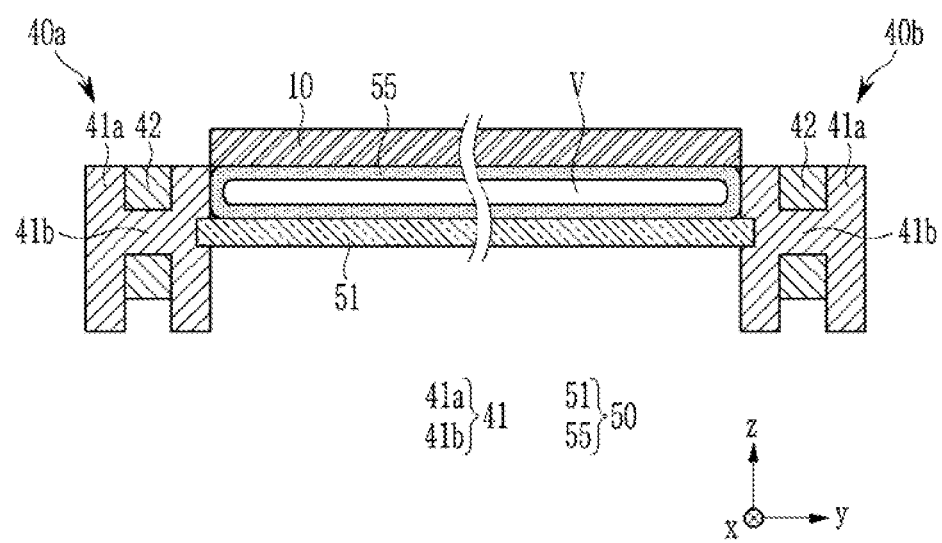
FIG. 7 is a cross-sectional view taken along a line V-V' in FIG. 4.
Figure 8:
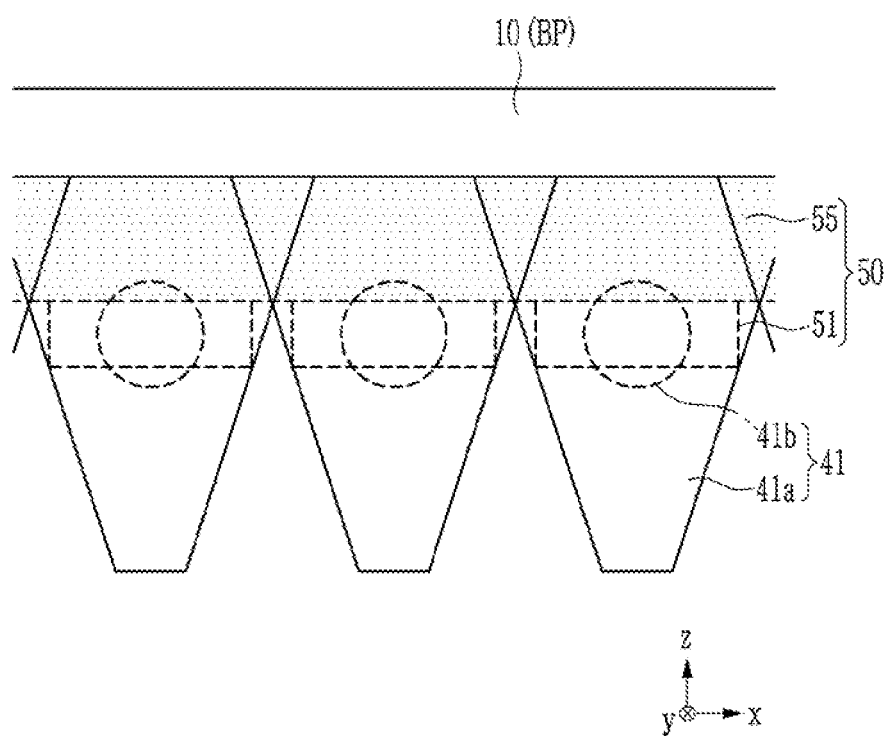
FIG. 8 is a lateral view taken along a line in FIG. 4.
Figure 9:
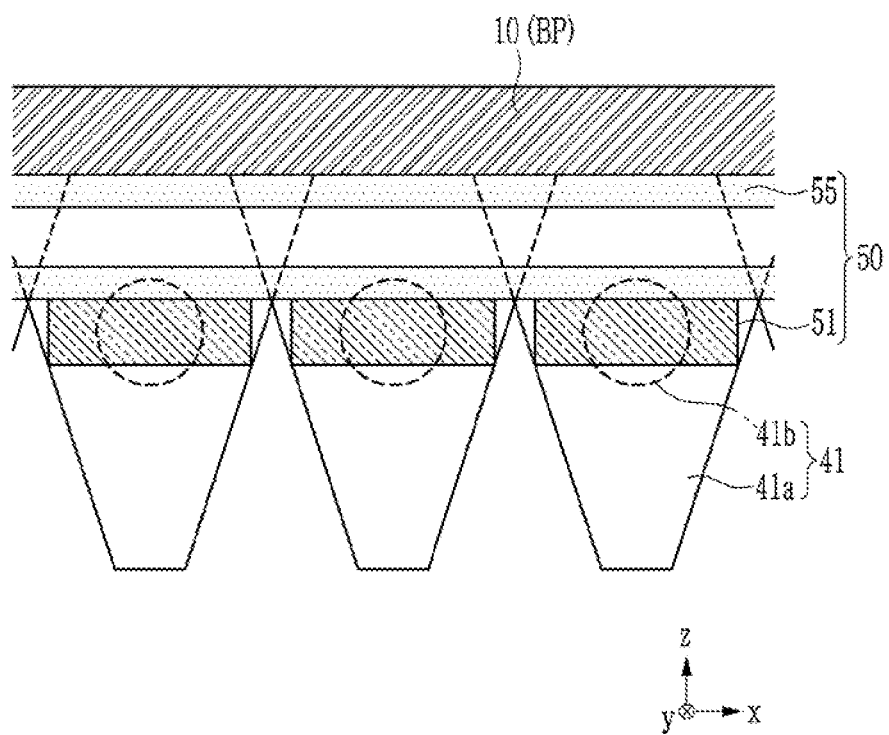
FIG. 9 is a cross-sectional view taken along a line IX-IX' in FIG. 4.
Figure 10:
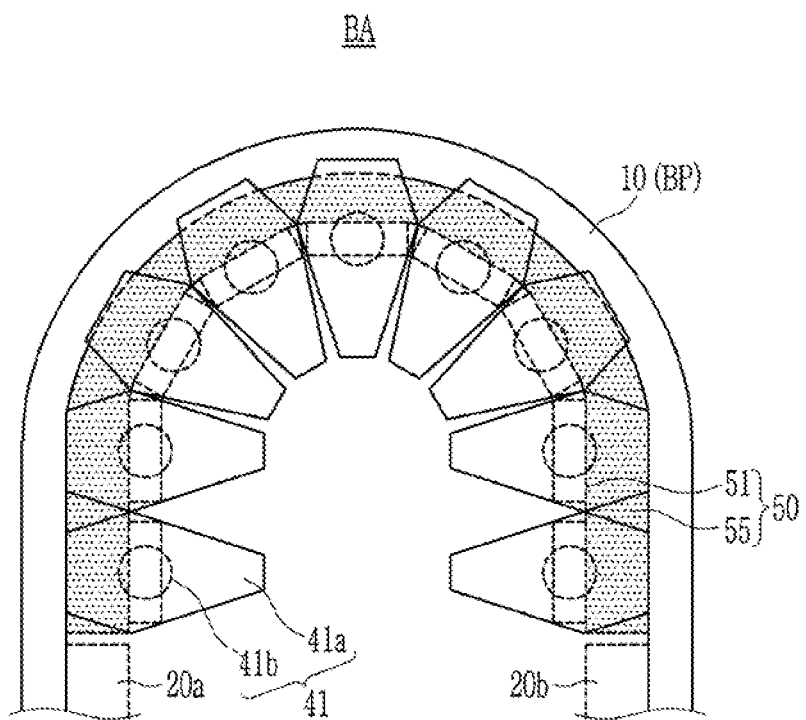
FIG. 10 is a lateral view illustrating a display device shown in FIG. 4 in a first folding state.
Figure 11:
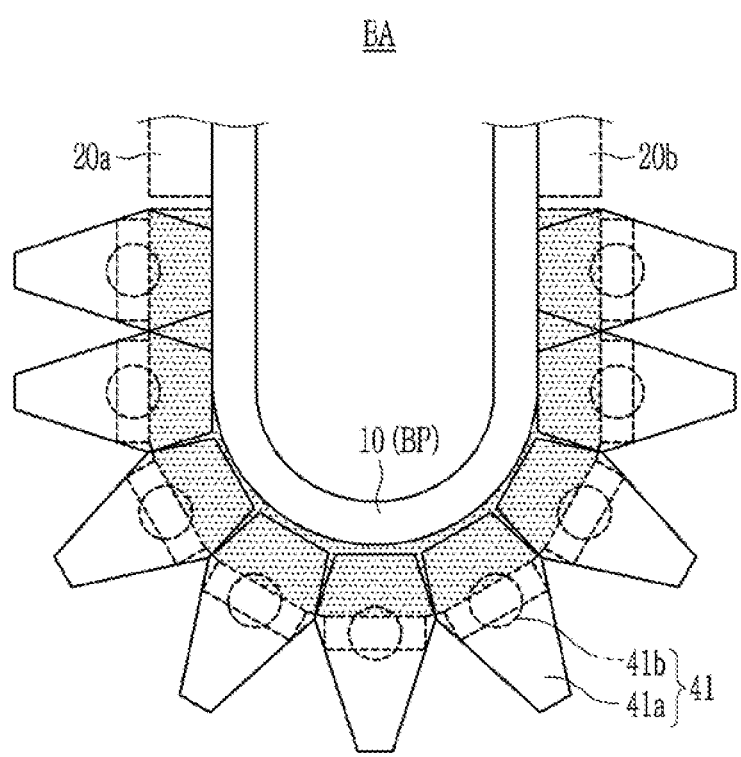
FIG. 11 is a lateral view illustrating a display device shown in FIG. 4 in a second folding state.

FIG. 4 is a top plan view of a foldable display device according to an exemplary embodiment of the present inventive concept. FIG. 5 is a lateral view taken along a line V-V' in FIG. 4. FIG. 6 is a top plan view of a foldable display device shown in FIG. 4 without a display panel. FIG. 7 is a cross-sectional view taken along a line V-V' in FIG. 4. FIG. 8 is a lateral view taken along a line VIII-VIII' in FIG. 4. FIG. 9 is a cross-sectional view taken along a line IX-IX' in FIG. 4. FIG. 10 is a lateral view showing a bending portion of a display device shown in FIG. 4 in a first folding state. FIG. 11 is a lateral view showing a display device shown in FIG. 4 in a second folding state.

FIG. 4 to FIG. 9 show a state in which the foldable display device 1 is completely unfolded. In FIG. 4 to FIG. 6, a pressure controller 60, a connection pipe 71, and a connector 72 are disposed inside the foldable display device 1 such that they are not visible from the outside. These elements are indicated by solid lines for clarity. In FIG. 8 to FIG. 11, the constituent elements that are not shown in the side or the cross-sectional views are indicated by dotted lines to represent positional relationships with other constituent elements.

Referring to FIG. 4 to FIG. 11, the display device 1 includes a frame 30 and a display panel 10. The frame 30 is configured to allow the display panel 10 to be folded in a folding area thereof. The display device 1 also includes a supporting plate 20 and a supporter 50, which support the display panel 10, and a hinge unit 40 for folding the display device 1. The display device 1 also includes at least one pressure controller 60.

The display panel 10 is a panel that is entirely flat (e.g. planar) and relatively thin. The display panel 10 includes a plurality of pixels making a screen displaying an image. In the display panel 10, the area that is not covered by the frame 30 may correspond to the screen. The display panel 10 may be an organic light emitting diode (OLED) panel in which a light-emitting element such as an organic light emitting diode is formed on the substrate, and a functional film such as a protection film may be attached thereto. The display panel 10 may be in the form of a quadrangle having a constant overall thickness. The display device 1 may include a driver for driving the display panel 10, and the driver may be electrically connected to the display panel 10 or may be formed in the display panel 10.

The display panel 10 is a flexible panel of which at least a portion may be bent. For example, the display panel 10 may include at least an area that is flexible, this area corresponding to the bending area BA of the display device 1. The display panel 10 includes a bending portion BP as the area corresponding to the bending area BA of the display device 1. The display panel 10 includes a first flat portion FBa and a second flat portion FBb disposed at respective sides of the bending area BA. The first flat portion FBa and the second flat portion FBb may be respectively disposed at the first flat area FAa and the second flat area FAb of the display device 1. The bending portion BP of the display panel 10 may be flexible and bendable.

The bending portion BP of the display panel 10 may be supported by the supporter 50, and a portion except for the bending portion BP of the display panel 10 may be supported by the supporting plate 20.

The supporting plate 20 includes a first supporting plate 20a disposed at the first flat area FAa and a second supporting plate 20b disposed at the second flat area FAb. The first supporting plate 20a and the second supporting plate 20b may each be quadrangle plates having a consistent thickness. Both surfaces, i.e. the upper surface and the lower surface, may be flat (e.g. planar) and the upper surface may be in contact with the display panel 10 and may be flat thereupon. The first flat portion FBa of the display panel 10 is attached to the first supporting plate 20a by an adhesive such as a pressure sensitive adhesive (PSA) and/or an optically clear adhesive (OCA), and the second flat portion FBb is attached to the second supporting plate 20b. Accordingly, the first supporting plate 20a and the second supporting plate 20b may support the first flat portion FBa and the second flat portion FBb so as to maintain the flat state without deformation. Also, when the display device 1 is folded or unfolded, the display panel 10 and the supporting plate 20 may be moved, particularly slid together within or on the frame 30.

The frame 30 includes a first frame 30a disposed at the first flat area FAa and a second frame 30b disposed at the second flat area FAb. The first frame 30a and the second frame 30b may each be coupled to the hinge unit 40, and accordingly the display device 1 may be folded so that the first frame 30a and the second frame 30b face each other.

The hinge unit 40 is disposed to correspond to the bending area BA along the x direction. The hinge unit 40 may be disposed so that it does not overlap or substantially does not overlap the display panel 10. The hinge unit 40 may include a first hinge unit 40a and a second hinge unit 40b disposed at opposite sides of the bending area BA in the second direction y. The first hinge unit 40a and the second hinge unit 40b are coupled to both sides of the first frame 30a and the second frame 30b, respectively, and accordingly, the first frame 30a and the second frame 30b may be folded without being twisted as the display device 1 is folded.

The first hinge unit 40a and the second hinge unit 40b may respectively include a multi-joint hinge structure, and for example, may include rotating parts 41 and linkers 42 connecting the rotating parts 41 so that the hinge unit 40 may be rotatable.

Each rotating part 41 includes a rotation limiter 41a and a spindle 41b. The rotation limiter 41a may be a polygonal plate having a constant thickness, and may have a shape in which the width decreases toward the upper side and/or the lower side from the spindle 41b. The rotation limiter 41a may be a hexagonal plate, for example. The center of the spindle 41b corresponds to the hinge axis. The rotation limiter 41a may rotate, together with the spindle 41b, about the spindle 41b, but at the same time serves to limit the rotation. In the state in which the display device 1 is unfolded, the rotating parts 41 are arranged adjacently in the first direction x. The axis direction of the spindles 41b may be parallel to the second direction y. The linker 42 rotatably connects the spindles 41b to each other. When an external force for folding or unfolding the display device 1 is applied, the linker 42 allows the spindles 41b to be rotated, while preventing the spindles 41b from rotating when no external force is applied. Accordingly, the display device 1 may remain relatively engaged in its desired state, be it the flat state or the bent state, until intentionally acted upon by the user. Through this structure, the first hinge unit 40a and the second hinge unit 40b may be bent like a multi-joint, and may maintain either the bent state or the unfolded state until the user desires to change its state.

Due to the polygonal shape of the rotation limiters 41a, the adjacent rotation limiters 41a may rotate until the facing sides thereof are in contact with each other or nearly in contact with each other. Thereafter, the polygonal shape of the rotation liners 41a will act to prevent further rotation. Therefore, the bending area BA of the display device 1 may be bent to a predetermined extent without excessively bending, and the bending portion BP of the display panel 10 and the like may be prevented from being damaged by over bending or twisting. In FIG. 10, in the out-folding, the faces of the rotation limiters 41a disposed above the spindle 41b in each rotating part 41 are spaced apart from each other, and the faces of the rotation limiters 41a disposed below the spindle 41b are close to each other. At this time, the bending area BA and the bending portion BP may be bent only until the faces of the rotation limiters 41a approaching each other are in contact with one another. Referring to FIG. 11, the faces of the rotation limiters 41a disposed above the spindle 41b in each rotating part 41 are close to each other, and the faces of the rotation limiters 41a disposed below the spindle 41b are spaced apart from each other at the time of the in-folding. Similarly, the bending area BA and the bending portion BP may be bent only until the faces of the rotation limiters 41a approaching each other are in contact with one another.

In the embodiment shown, the rotation limiter 41a is disposed on both sides of one spindle 41b, however, one rotation limiter 41b may be disposed on only one side of the spindle 41b. The rotation limiter 41a and the spindle 41b may be integrally formed, and may be assembled with each other. The structure of the hinge unit 40 may be varied.

The supporter 50 is disposed between the first supporting plate 20a and the second supporting plate 20b below the display panel 10. The supporter 50 is also disposed between the first hinge unit 40a and the second hinge unit 40b. The supporter 50 overlaps the bending portion BP of the display panel 10 as a whole.

The supporter 50 includes supporting strips 51 and a tubular supporter 55. The tubular supporter 55 is disposed between the supporting strips 51 and the display panel 10. The upper surface of the tubular supporter 55 is in contact with the bending portion BP of the display panel 10, and the lower surface of the tubular supporter 55 is in contact with the supporting strips 51. The supporting strips 51 are spaced apart from the bending portion BP by the thickness of the tubular supporter 55. The bending portion BP of the display panel 10 is not attached to the tubular supporter 55 and the facing surfaces of the bending portion BP, and the tubular supporter 55 is configured to slide when the display device 1 is folded or unfolded. Alternatively, at least a portion of the bending portion BP may be attached to the tubular supporter 55. For example, in the first direction x, the center of the bending portion BP may be attached to the tubular supporter 55 along the second direction y.

The supporting strips 51 are arranged substantially corresponding to the width of the bending area BA in the first direction x. The supporting strips 51 may have a length and width corresponding to the bending portion BP of the display panel 10. Each supporting strip 51 is elongated, and at least an upper surface thereof has a flat shape. The supporting strip 51 may be a rod having a cross-sectional shape of a quadrangle (particularly, a rectangle). Thus the supporting strip 51 may be prism shaped, for example, the supporting strip 51 may have the shape of a rectangular prism. The supporting strip 51 is connected to the first hinge unit 40a and the second hinge unit 40b. For example, the supporting strip 51 is coupled to the rotating part 41 of the first hinge unit 40a and the rotating part 41 of the second hinge unit 40b, and may move in the same axis as the rotating part 41 when the rotating part 41 moves. Therefore, as shown in FIG. 10 and FIG. 11, at the time of bending of the hinge unit 40, the supporting strip 51 maintains its shape, but the combination of the supporting strips 51 may be bent. For this movement, in the unfolded state of the display device 1, the supporting strips 51 might not be in contact with each other and may be arranged at a predetermined interval. The combination of the supporting strip 51 and the rotating part 41 may be arranged such that the supporting strip 41 is inserted in a groove of the rotating part 41. Alternatively, the supporting strip 51 may be integrally formed with the rotating part 41.

The tubular supporter 55 may have a length and a width corresponding to the bending portion BP of the display panel 10. The tubular supporter 55 has a structure in which a space V is formed therein. The tubular supporter 55 may have a generally flat shape when the display device 1 is in an unfolded state. The inner space V of the tubular supporter 55 may be filled with a fluid such as air or a liquid. The tubular supporter 55 may include an injection hole in fluid communication with the inner space V. When the fluid is injected into the inner space V of the tubular supporter 55 through the injection hole, the tubular supporter 55 may expand to increase its thickness. When the fluid escapes from the inner space V of the tubular supporter 55 through the injection hole, the thickness may be reduced by the contracting of the tubular supporter 55.

The expansion and contraction of the tubular supporter 55 may be performed by the pressure controller 60 connected to the tubular supporter 55 through the connection pipe 71. The pressure controller 60 serves to increase or decrease the internal pressure of the tubular supporter 55. For example, the pressure controller 60 may operate to inject the fluid into the inner space V of the tubular supporter 55 via the connection pipe 71 or to draw out the fluid from the inner space V.

The pressure controller 60 may include a cylinder 61 and a piston 62. The cylinder 61 may be a pneumatic cylinder or a hydraulic cylinder. The cylinder 61 may be immovably fixed (e.g., fixed to the frame 30) in the display device 1, and the piston 62 may be connected to the supporting plate 20 by the connector 72. The connection pipe 71 may be in fluid communication with the cylinder 61. Accordingly, when the supporting plate 20 moves, the piston 62 moves together therewith so that the fluid in the cylinder 61 may move to the tubular supporter 55 through the connection pipe 71 or the fluid in the tubular supporter 55 may move into the cylinder 61 through the connection pipe 71. The piston 62 may be operatively connected to the power device, such as a motor, rather than the supporting plate 20. In this case, a sensor configured for sensing the folding state of the display device 1 or the moving state of the supporting plate 20 may be further included. The pressure controller 60 may include the cylinder 61 and a plunger instead of the cylinder 61 and the piston 62.

In FIG. 4, four pressure controllers 60 are disposed at the upper side and the lower side of the display panel 10 and the supporting plate 20, however the display device 1 may contain fewer than four or more than four pressure controllers 60. The pressure controller 60 may be disposed on the left or right side of the display panel 10, or may be disposed on the back side of the display panel 10 and the supporting plate 20 (i.e., the position overlapping the supporting plate 20).

As the tubular supporter 55 shrinks during the out-folding of the display device 1 and expands during the in-folding of the display device 1, the bending portion BP of the display panel 10 may be prevented from being deformed during the folding of the display device 1. For example, referring to FIG. 10, the stress of the display device 1 increases during the out-folding of the bending portion BP, but since it bends in the state of being supported to the tubular supporter 55, the stress (particularly tensile stress) of the bending portion BP may be further increased. Therefore, the bending portion BP may be deformed (e.g., expands), and the devices and wires disposed in the bending portion BP may be damaged. However, if the tubular supporter 55 supporting the bending portion BP shrinks during the out-folding of the display device 1, the external force applied to the bending portion BP decreases, thereby reducing the stress of the bending portion BP. Therefore, it is possible to prevent the bending portion BP from being deformed or damaged. Also, since the flat tubular supporter 55, rather than the supporting strips 51 which may have step differences, directly supports the bending portion BP of the display panel 10, the bending portion BP may have the flat surface that does not bend and corresponds to the surface of the tubular supporter 55. Thus, the tubular supporter 55 may complement the step of the supporting strips 51 and provide a smooth appearance of the bending portion BP.

Referring to FIG. 11, the bending portion BP at the in-folding of the display device 1 may be bent in the state of being supported by the tubular supporter 55, the stress (particularly compressive stress) of the bending portion BP may increase, and the bending portion BP may be maintained with the deformed state. However, when the tubular supporter 55 expands during the in-folding of the display device 1, the bending portion BP is prevented from being stretched, and the deformation of the bending portion BP may be prevented.

As above-described, as the contraction and expansion of the tubular supporter 55 complement each other for the stress of the bending portion BP of the display panel 10 during the out-folding and in-folding of the display device 1, the deformation and the damage of the bending portion BP of the display panel 10 may be prevented or reduced.

The tubular supporter 55 may be formed of a flexible material as it may be bent when the display panel is bending in the bending area BA. For example, the tubular supporter 55 may be formed of an elastomer having excellent restoring force. However, the present invention is not limited thereto, and the tubular supporter 55 may be formed of various materials such as a metal, a plastic, etc. The supporter 50 may include the tubular supporter 55 having the width and length corresponding to the bending portion BP, but may also include a plurality of tubular supporters.

When folding the display device 1, the bending portion BP and the supporter 50 are bent with different curvature radiuses. For example, during the out-folding of the display device 1, the curvature radius of the bending portion BP is larger than the curvature radius of the supporter 50, while during the out-folding of the display device 1, the curvature radius of the bending portion BP is smaller than the curvature radius of the supporter 50. Therefore, if the display panel 10 is fixed in the frame 30 so as not to be moved, the tensile stress is increased at the out-folding of the display device 1, and the compressive stress largely acts at the in-folding of the display device 1, thereby the bending portion BP may be deformed and damaged. Thus, the display panel 10 may be slidably disposed in the frame 30 rather than being fixed in the frame 30.

Since the first flat portion FBa and the second flat portion FBb of the display panel 10 are respectively attached to the first supporting plate 20a and the second supporting plate 20b, the display panel 10 may slide together with the first supporting plate 20a and the second supporting plate 20b. For example, during the out-folding of the display device 1, the first flat portion FBa and the first supporting plate 20a, and the second flat portion FBb and the second supporting plate 20b, may slide to be spaced apart from both ends of the frame 30. The frame 30 may include a slit 35 for accommodating both ends of the display panel 10 and the supporting plate 20 as shown in FIG. 5, for example, so that this movement of the combination of the display panel 10 and the supporting plate 20 is possible. The space in the slit 35 may increase due to the sliding of the display panel 10 and the supporting plate 20 during the out-folding of the display device 1, and may decrease during the in-folding.

As described above, the piston 62 of the pressure controller 60 may be connected to the supporting plate 20 by the connector 72. The pressure controller 60 disposed on the left side of the bending area BA may be connected to the first supporting plate 20a, and the pressure controller 60 disposed on the right side of the bending area BA may be connected to the second supporting plate 20b. Through this connection, the pressure controller 60 may be operated to adjust the pressure of the tubular supporter 55 in accordance with either the out-folding or in-folding of the display device 1, without the need to use an additional powered device. In this sense, adequate support may be provided to the bending region using purely passive forces.

For example, when the display device 1 is out-folded, if the first supporting plate 20a and the second supporting plate 20b are slid, the pistons 62 connected to the first supporting plate 20a and the second supporting plate 20b move in the direction in which the first supporting plate 20a slides, for example, in the direction away from both ends of the frame 30. Then, the fluid in the tubular supporter 55 moves into the cylinder 61 of the pressure controller 60 through the connection pipe 71, the internal pressure of the tubular supporter 55 decreases, and the tubular supporter 55 contracts. On the other hand, when the display device 1 is in-folded, if the first supporting plate 20a and the second supporting plate 20b are slid, the pistons 62 connected to the first supporting plate 20a and the second supporting plate 20b slide in the direction in which the first supporting plate 20a slides, that is, in the direction approaching both ends of the frame 30. Then, the fluid in the cylinder 61 of the pressure controller 60 moves into the tubular supporter 55 through the connection pipe 71, the internal pressure of the tubular supporter 55 increases, and the tubular supporter 55 expands.

In describing exemplary embodiments of the present invention, the description of elements that are the same as elements that have already been described may be omitted and a focus of the subsequent description may be on difference from what has already been described.

Figure 12:
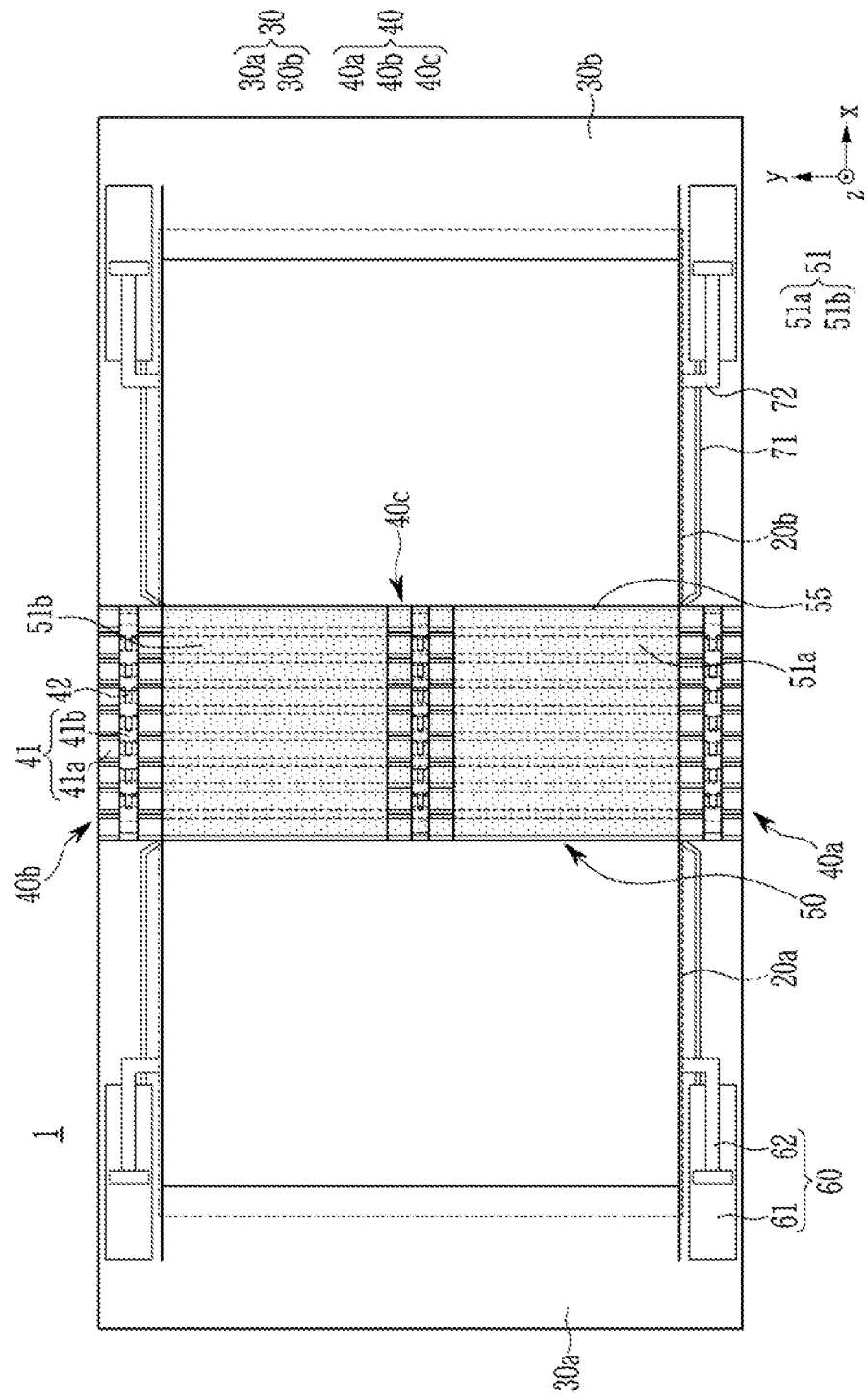
FIG. 12 is a top plan view illustrating a foldable display device according to an exemplary embodiment of the present inventive concept.

FIG. 12 is a top plan view of a foldable display device according to an exemplary embodiment of the present inventive concept. FIG. 12 shows the state without the display panel 10, like FIG. 6.

Referring to FIG. 12, the hinge unit 40 further includes a third hinge unit 40c positioned in the approximate middle of the supporter 50a, as well as the first hinge unit 40a and the second hinge unit 40b disposed on respective sides of the first frame 30a and the second frame 30b. When disposing the hinge unit 40 exclusively on opposite sides of the supporting strips 51, the center of the supporting strips 51 may tend to sag or be otherwise deformed. This problem may be compensated for by disposing the third hinge unit 40c in the middle of the supporting strips 51.

The third hinge unit 40c may have substantially the same structure as the first hinge unit 40a and the second hinge unit 40b. However, the first hinge unit 40a and the second hinge unit 40b might only be connected to supporting strips 51 at one side, while the third hinge unit 40c may be connected with supporting strips 51 at both sides. For example, each supporting strip 51 may be divided into a first portion 51a disposed between the first hinge unit 40a and the third hinge unit 40c and a second portion 51b disposed between the second hinge unit 40b and the third hinge unit 40c. Ends of the first portion 51a may be respectively connected to the first hinge unit 40a and the third hinge unit 40c, and ends of the second portion 51b may be connected to the second hinge unit 40b and the third hinge unit 40c, respectively.

Figure 13:
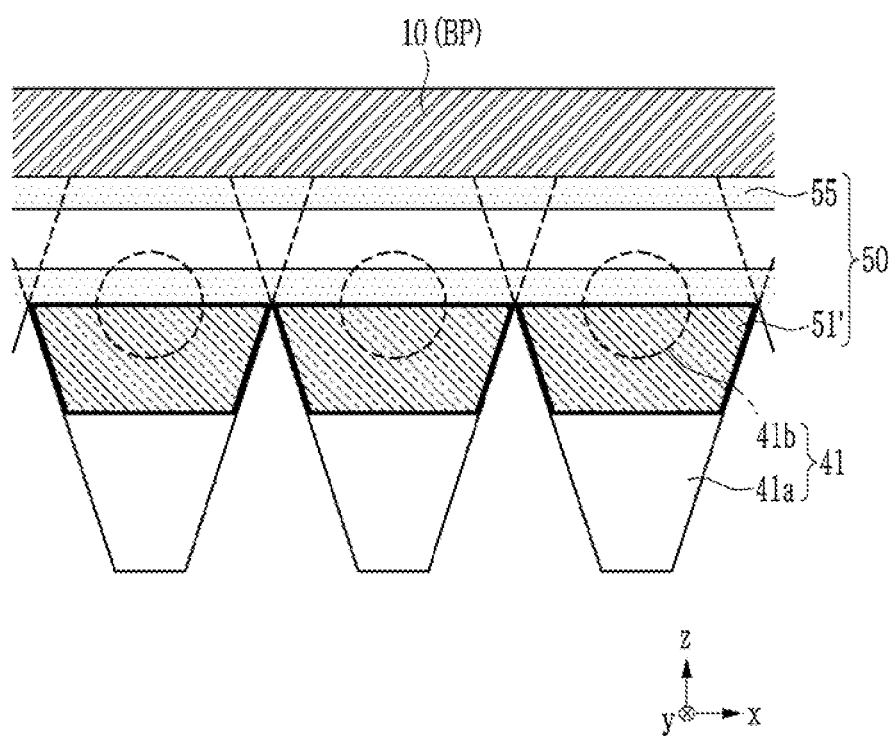
FIG. 13 is a cross-sectional view illustrating a bending portion of a display device according to an exemplary embodiment of the present inventive concept.

FIG. 13 is a cross-sectional view of a bending portion of a display device according to an exemplary embodiment of the present disclosure. The cross-sectional view of FIG. 13 may correspond to a cross-sectional area taken along a line IX-IX' in FIG. 4.

Referring to FIG. 13, the supporter 50 includes supporting strips 51' and the tubular supporter 55, and the tubular supporter 55 is disposed between the supporting strips 51' and the bending portion BP of the display panel 10. The embodiment of FIG. 13 has a difference from the above-described supporting strip 51 in the shape and position of the supporting strip 51'.

The supporting strip 51' has a substantially inverted trapezoid cross-sectional shape as a whole. The supporting strip 51' is positioned so that its upper surface coincides with the center of the spindle 41b of the rotating part 41, which is the hinge axis of the hinge unit 40. In addition, the adjacent supports 51' are in contact or close to each other at the upper edges (e.g., the edges that are in contact with the tubular support 55). When the supporting strips 51' are formed as above-described, while being closely disposed so that the gap between the supporting strips 51' is minimized or disappears, the supporting strips 51' may be moved together with the rotating parts 41 so as to allow the out-folding and in-folding of the display device 1. In addition to the cross-sectional shape of the inverted trapezoid, the supporting strips 51 may have a cross-sectional shape such as an inverted triangle, for example, in which the width decreases from the upper side toward the lower side while the upper surface is flat.

Finally, the configuration of the display panel 10, which may be included in the display device 1 according to an exemplary embodiment of the present inventive concept, is described with reference to FIG. 14.

Figure 14:
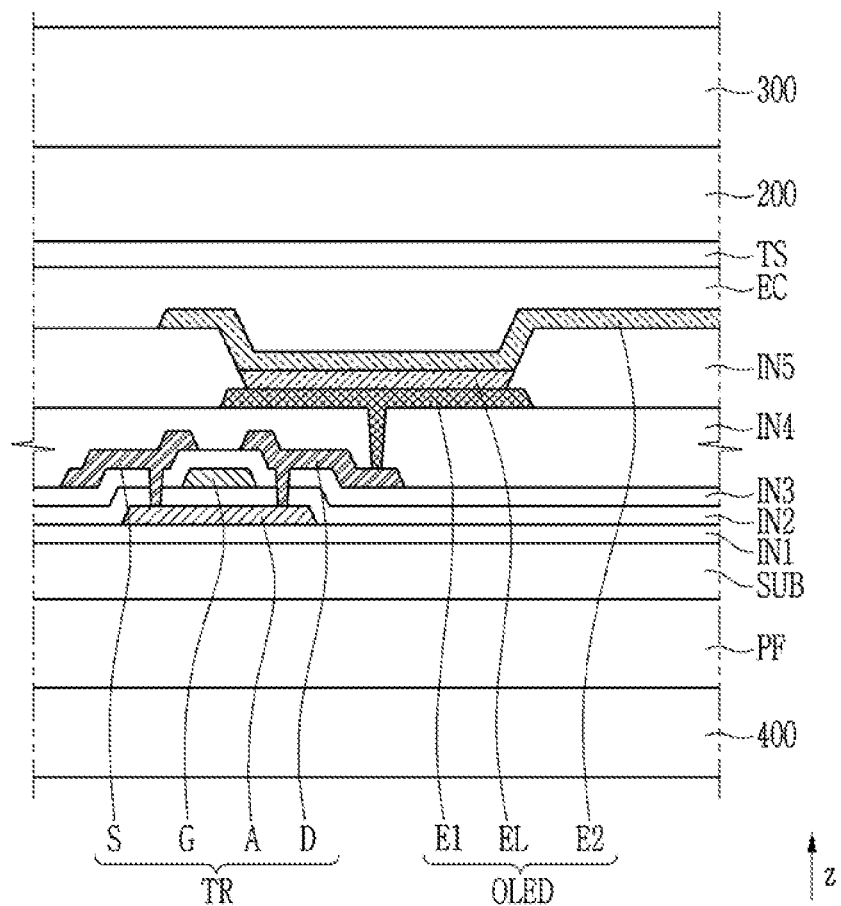
FIG. 14 is a lateral view of a display panel according to an exemplary embodiment of the present inventive concept.

FIG. 14 is a cross-sectional view of a display panel 10 according to an exemplary embodiment of the present inventive concept. FIG. 14 is a cross-sectional view illustrating one example of the stacked structure of the display panel 10. The cross-sectional view shown in FIG. 14 may approximately correspond to one pixel area.

The display panel 10 may include a substrate SUB, a transistor TR formed on the substrate SUB, and an organic light emitting diode OLED connected to the transistor TR.

The substrate SUB may be a flexible substrate that may include a polymer such as polyimide (PI), polyamide (PA), and/or polyethylene terephthalate (PET). The substrate SUB may include a barrier layer to prevent moisture, oxygen, etc. from penetrating from the outside. For example, the substrate SUB may include at least one polymer layer and at least one barrier layer, and the polymer layer and the barrier layer may be alternately stacked.

A first insulating layer IN1 is disposed on the substrate SUB. The first insulating layer IN1 may be referred to as a buffer layer, and in the process of forming a semiconductor layer A, the first insulating layer IN1 may block the impurity from diffusing from the substrate SUB to the semiconductor layer A, and may reduce stress applied to the substrate SUB. The barrier layer and the first insulating layer IN1 may each include an inorganic insulating material such as a silicon oxide and/or a silicon nitride.

The semiconductor layer A of the transistor TR is disposed on the first insulating layer IN1, and a second insulating layer IN2 is disposed on the semiconductor layer A. The semiconductor layer A includes a source area and a drain area. A channel area is disposed between these areas. The semiconductor layer A may include a semiconductor material such as polysilicon, an oxide semiconductor, amorphous silicon, etc. The second insulating layer IN2 may be referred to as a gate insulating layer, and may include an inorganic insulating material.

A gate conductor including a gate electrode G of the transistor TR is disposed on the second insulating layer IN2. The gate conductor may include a metal or a metal alloy thereof such as molybdenum (Mo), copper (Cu), aluminum (Al), silver (Ag), chromium (Cr), tantalum (Ta), and/or titanium (Ti).

A third insulating layer IN3 is disposed on the gate conductor. The third insulating layer IN3 may be referred to as an interlayer insulating layer, and may include an inorganic insulating material.

A data conductor including a source electrode S and a drain electrode D of the transistor TR is disposed on the third insulating layer IN3. The source electrode S and the drain electrode D are respectively connected to a source area and a drain area of the semiconductor layer A through contact holes formed in the third insulating layer IN3 and the second insulating layer IN2. The data conductor, for example, may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), etc., and/or a metal alloy thereof.

A fourth insulating layer IN4 is disposed on the data conductor. The fourth insulating layer IN4 may be referred to as a planarization layer, and may include an organic insulating material.

A first electrode E1 is disposed on the fourth insulating layer IN4.

The first electrode E1 may be referred to as a pixel electrode. The first electrode E1 is connected to the drain electrode D through a contact hole formed in the fourth insulating layer IN4, thereby receiving a data signal controlling luminance of the organic light emitting diode OLED.

A fifth insulating layer IN5 is disposed on the fourth insulating layer IN4. The fifth insulating layer IN5 may be referred to as a pixel defining layer, and the fifth insulating layer IN5 has an opening at least partially overlapping the first electrode E1. In the opening of the fifth insulating layer IN5, the emission layer EL is disposed on the first electrode E1 and the second electrode E2 is disposed on the emission layer EL. The second electrode E2 may be referred to as a common electrode CE.

The first electrode E1, the emission layer EL, and the second electrode E2 together form the organic light emitting diode OLED. The first electrode E1 may be an anode of the organic light emitting diode OLED, and the second electrode E2 may be a cathode of the organic light emitting diode OLED.

An encapsulation layer EC is disposed on the second electrode E2. The encapsulation layer EC may seal the organic light emitting diode OLED to prevent ambient moisture or oxygen from penetrating therein. The encapsulation layer EC may include at least one inorganic material layer and at least one organic material layer, and the inorganic material layer and the organic material layer may be alternately stacked.

A touch sensor layer TS may be disposed on the encapsulation layer EC. The touch sensor layer TS may include touch electrodes formed of a transparent conductive material such as ITO or IZO, a metal mesh, and the like. The touch electrodes may be formed of a single layer or multiple layers. The touch sensor layer TS may be directly formed on the encapsulation layer EC or separately formed and attached to the encapsulation layer EC.

An antireflection layer 200 for reducing the reflection of external light may be disposed on the touch sensor layer TS. The anti-reflection layer 200 may include a polarization layer. The antireflection layer 200 might not be separately formed, and may be formed along with the polarization layer as a single entity. The encapsulation layer EC and/or the touch sensor layer TS may be formed with a refractive index matching structure to obtain an antireflection effect.

A cover window 300 for protecting the upper surface of the display panel 10 as a whole may be disposed on the antireflection layer 200. The cover window 300 is optically transparent, and is a flexible window in which at least a portion may be bent. For example, the cover window 300 may be flexible and bendable in the area at least corresponding to the bending area BA of the display device 1, and may be entirely flexible. The cover window 300 can be a polymer film made of a polymer such as polyimide (PI), polyethylene terephthalate (PET), or polyurethane (PU) to have a flexible characteristic. The cover window 300 may be a glass film in which the area corresponding to the bending area BA of the display device 1 is thin (e.g., with a thickness of less than 100 μm) so as to be flexible. The cover window 300 may be attached to the antireflection layer 200 by an adhesive such as an OCA or a PSA.

A protective layer PF for protecting the display panel 10 may be disposed under the substrate SUB, and a functional layer 400 may be disposed under the protective layer PF. The functional layer 400 may include a functional sheet such as a cushion layer, a heat radiation sheet, a light shielding sheet, and/or a waterproof tape.

Although the display panel 10 is described as an organic light emitting panel, the display panel 10 may be one of various display panels, such as a display panel including a light emitting diode (LED) or a display panel including a liquid crystal layer.

While exemplary embodiments of the inventive concept have been described in detail with reference to the various drawings, it is to be understood that the inventive concept is not limited to the disclosed embodiments. On the contrary, the inventive concept is intended to cover various modifications and equivalent arrangements.

What is claimed is:

1. A foldable display device, comprising:
a display panel including a bending portion; and
a support structure disposed under the display panel and supporting the bending portion,
wherein the support structure includes a tube,
wherein the tube is filled with fluid.

2. The foldable display device of claim 1, wherein:
the support structure includes a plurality of strips; and
the tube is disposed between the strips and the display panel.

3. The foldable display device of claim 1, wherein the tube is in contact with the bending portion.

4. The foldable display device of claim 1, wherein the tube is configured to expand or contract as the foldable display device is folded.

5. The foldable display device of claim 1, wherein the tube is configured to expand or contract as the bending portion is bent.

6. The foldable display device of claim 1, wherein:
the folded display device includes a screen displaying an image, wherein the screen is configured to be foldable such that the screen faces the outside whilst folded; and
the tube is configured to expand as the foldable display device is folded.

7. The foldable display device of claim 1, wherein: the foldable display device includes a screen displaying an image, wherein the screen is configured to be folded such that the screen faces itself whilst folded; and the tube is configured to contract as the foldable display device is folded.

8. A foldable display device, comprising:
a display panel including a bending portion;
a support structure disposed under the display panel and supporting the bending portion, the support structure includes a tube; and
a pressure controller configured to control an interior pressure of the tube.

9. The foldable display device of claim 8, wherein:
the pressure controller includes a cylinder and a piston; and
the tube is connected to the cylinder and is in fluid communication with the cylinder.

10. The foldable display device of claim 9, wherein:
the display panel further includes a flat portion;
the foldable display device further includes a support plate disposed under the flat portion and configured to support the flat portion; and
the piston is connected to the support plate.

11. The foldable display device of claim 10, wherein the support plate is configured to move in one direction as the foldable display device is folded, and the piston is configured to move in a movement direction of the support plate.

12. The foldable display device of claim 11, wherein the flat portion is attached to the support plate, and the bending portion is not attached to the support structure.

13. The foldable display device of claim 2, wherein the strips have cross-sectional shapes of a hexagon or inverted trapezoid.

14. The foldable display device of claim 13, wherein adjacent edges of adjacent strips among the strips are in contact with each other.

15. A foldable display device, comprising:
- a display panel including a first flat portion, a second flat portion, and a bending portion disposed between the first flat portion and the second flat portion;
- a first support plate disposed under the first flat portion and supporting the first flat portion;
- a second support plate disposed below the second flat portion and supporting the second flat portion;
- a support structure disposed below the bending portion and supporting the bending portion; and
- a hinge unit disposed along at least one side of the bending portion,
- wherein the support structure includes a plurality of strips and a tube disposed between the strips and the bending portion, and
- wherein the tube is configured to expand or contract as the foldable display device is folded.

16. The foldable display device of claim 15, wherein an upper surface of the tube is in contact with the bending portion, and a lower surface of the tube is in contact with the strips.

17. The foldable display device of claim 15, further comprising a pressure controller for supplying a fluid to or withdrawing the fluid from the tube,
- wherein the pressure controller is connected to the tube through a connection pipe.

18. The foldable display device of claim 17, wherein the pressure controller is connected to the first support plate or the second support plate by a connector.

19. The foldable display device of claim 15, wherein the tube includes an elastomer.

20. The foldable display device of claim 15, wherein each of the strips has an inverted trapezoid cross-sectional shape, and upper surfaces of each of the strips coincides with a center of a hinge axis of the hinge unit.

21. The foldable display device of claim 15, wherein:
- the hinge unit includes a first hinge unit and a second hinge unit disposed on opposite sides of the bending portion and a third hinge unit disposed between the first hinge unit and the second hinge unit, and
- each of the strip includes a first portion connected between the first hinge unit and the third hinge unit and a second portion connected between the second hinge unit and the third hinge unit.

* * * * *